United States Patent [19]

Waite

[11] Patent Number: 5,157,664
[45] Date of Patent: Oct. 20, 1992

[54] TESTER FOR SEMICONDUCTOR MEMORY DEVICES

[75] Inventor: Harold C. Waite, Garland, Tex.

[73] Assignee: Texas Instruments Incorporated, Dallas, Tex.

[21] Appl. No.: 411,054

[22] Filed: Sep. 21, 1989

[51] Int. Cl.⁵ .......................................... G06F 11/00
[52] U.S. Cl. ................................. 371/10.2; 371/21.2; 371/21.1
[58] Field of Search .................... 371/10.2, 21.2, 10.1, 371/10.3, 21.1, 21.3; 364/931.41

[56] References Cited

U.S. PATENT DOCUMENTS

| | | | |
|---|---|---|---|
| 3,962,687 | 6/1976 | Suzumura et al. | 340/173 R |
| 4,313,200 | 1/1982 | Nishiura | 371/25.1 |
| 4,346,459 | 8/1982 | Sud et al. | 371/10.2 |
| 4,384,348 | 5/1983 | Nozaki | 371/21.2 |
| 4,733,392 | 3/1988 | Yamaguchi | 371/21.1 |
| 4,797,886 | 1/1989 | Imada | 371/27 |
| 4,873,705 | 10/1989 | Johnson | 371/21.2 |
| 4,905,183 | 2/1990 | Kawaguchi et al. | 364/900 |
| 4,982,290 | 1/1991 | Nishi et al. | 358/310 |

Primary Examiner—Jerry Smith
Assistant Examiner—Ly V. Hua
Attorney, Agent, or Firm—Ronald O. Neerings; Lawrence J. Bassuk; Richard L. Donaldson

[57] ABSTRACT

An offline redundancy memory test system replaces fail memory equipment, under the control of a test system CPU, with fail memory equipment under the control of a second CPU. The second CPU is dedicated to the analysis of the contents of the offline redundancy memory test system fail memory, for redundancy identification and defect pattern analysis, at the conclusion of functional testing. Therefore, in a mass production wafer level memory test system, the test system CPU is free to prepare and execute non-functional tests on the next set of devices to be tested, thereby reducing overall memory test time by the amount of fail memory equipment analysis time previously taken by the test system CPU leading to a reduction in the total number of memory test systems required to provide redundancy memory testing.

9 Claims, 4 Drawing Sheets

TESTER FOR SEMICONDUCTOR MEMORY DEVICES

FIELD OF THE INVENTION

The present invention relates to test equipment for semiconductor memory devices and, more particularly, to a system which identifies a replacement scheme for removing defects in a memory device.

BACKGROUND

Semiconductor memory devices are binary circuits which store information in arrays of cells arranged in rows and columns. In the fabrication of these devices it is common for an array of memory cells to include one or more defects which prevent the proper performance of the memory circuit. If a type of defect occurs systematically it can often be causally analyzed and designed out. Other defects which are generally not systematic include short circuits between adjacent columns and open circuits within individual columns of memory cells. For analysis purposes the distribution of such defects in a memory device, as well as the distribution of the number of defects among a given production lot, may be considered random so that the yield of good devices in a lot can be modelled according to a Poisson distribution function. Typically, over the period of time that a particular device or family of devices is being produced in a given manufacturing facility the product yield can be improved by eliminating causes, e.g., particulate matter, of the above-mentioned random defects.

Generally, it is desirable to further improve the yield of memory devices by replacing defective segments of an array with redundant circuitry. During testing of the chip, defective columns of memory cells can be identified and replaced. Such redundancy techniques are especially suited for semiconductor memories because these devices comprise large numbers of repeating elements arranged in rows and columns. This array format lends itself to replacement of a defective portion with any of multiple identical redundant circuits.

The redundancy scheme may be implemented by providing a plurality of universal decode circuits for connection to redundant rows or columns. Appropriate fuses are included that can be opened to both activate select portions of the redundant circuitry and program individual circuits to be responsive to the appropriate addresses. For example, in dynamic random access memory devices (DRAM's) address integrity can be maintained by simply programming redundant column or row circuits to respond to defective addresses. Thus the address of each defective column or row is reassigned to a redundant circuit. In video and frame memory circuits the replacement procedure may require greater complexity in order to maintain the sequential nature of memory output. See U.S. Pat. No. 4,598,388 assigned to the assignee of the present invention.

Semiconductor memories of all types are being made with progressively higher bit densities and smaller cell sizes as the density of integrated memory circuits increases. In 1972 4K bit DRAMs were being designed while in 1982 one megabit devices were planned. Device densities of 64 and 256 Megabits may become mass produced during the 1990's. With increased memory capacity there must be improvement in associated performance parameters such as memory access and memory test time. This has necessitated development of more complex memory architectures and implementation of address scrambling formats.

Now, with the development of even denser memories, reduced feature sizes render these devices susceptible to defects caused by particulate matter which previously caused no problems in the fabrication process. Thus with further improvements in density there will be a greater challenge to reduce the number of random-type defects that can be repaired with redundancy schemes.

A problem associated with fabrication of memory devices having progressively greater densities is the increased amount of time required for testing and identifying replacement schemes to remove defects. Since the defects are random, each integrated circuit must be analyzed to identify an individual repair scheme. Total test time for a one megabit memory device is approximately seven seconds. The test time for a wafer can easily exceed 30 minutes. As memory density increases wafer size is expected to increase so that the number of devices formed on a wafer is not expected to decrease dramatically. Thus, as the time required for testing each device increases the time required for testing an entire wafer will increase proportionately For example, with current available technology the process of testing and identifying the repair scheme for a 16 megabit device will easily exceed 100 seconds. Assuming the same technology, the total time for developing replacement schemes for a wafer of 16 megabit devices will clearly exceed 7 hours.

Heretofore, inroads to reduce test and analysis time have come primarily by simultaneously testing several memory devices. For example, this technique has been effected by analyzing four 256K devices at once. Alternately, a one megabit device that is partitioned to provide 256K×4 memory can be tested by simultaneously writing test data to each of four 256K blocks of memory cells. A less desirable alternative is to reduce the number of tests performed on a device. This, of course, leads to reliability problems because critical defects which require repair may not be identified without comprehensive testing.

Some improvements have come through program optimization and significant gains in efficiency have also been realized with linear flow programs and by minimizing data manipulation. Nevertheless, further improvements in program efficiency are not seen as a solution to the progressively time consuming task of testing and analyzing memory circuits to provide repair schemes.

SUMMARY OF THE INVENTION

According to the invention a test system provides repair information for a semiconductor memory device of the type having redundant row or column lines. The system includes a a pattern generator, first and second microprocessors, a tester subsystem including a microprocessor controller and an analysis subsystem including a computer. The tester subsystem is operable in conjunction with a probe unit to write a test pattern to the memory device under test and read binary values stored in the memory device. Comparator circuitry is coupled to the tester subsystem to provide information identifying defective cells in the memory device based on differences between the test pattern and binary values read from the memory device. A fail memory stores the output of the comparator circuitry. The fail memory is under the read control of the analysis subsystem computer. The analysis subsystem is coupled to read and process information read from the fail memory to designate a column or row line for replacement with a redundant line thereby removing a defect in the memory device.

BRIEF DESCRIPTION OF THE FIGURES

The invention may best be understood by reference to the following detailed description when read in conjunction with the drawings wherein.

A preferred embodiment of the invention is now presented. However, it should be appreciated that the specific architecture, as well as the choice of system components, disclosed herein is exemplary and does not delimit the scope of the invention as defined by the claims which follow.

DETAILED DESCRIPTION OF THE INVENTION

Figure 1:
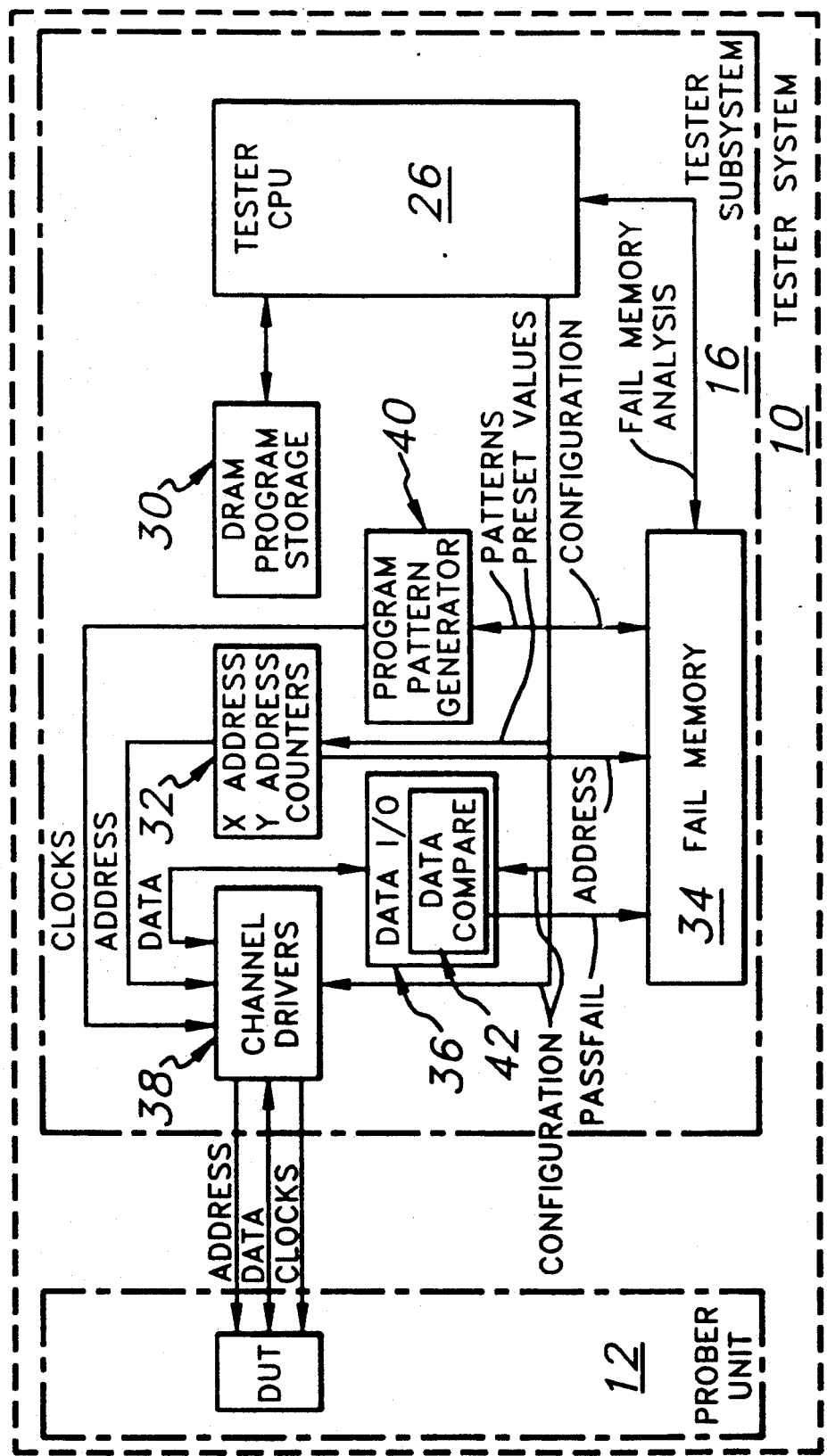
FIG. 1 illustrates in simple block form a memory test and analysis system of known prior art.

FIG. 1 illustrates a test and analysis system 10 which provides information for effecting repair of a semiconductor memory device. A typical test system 16 is Model Colt IIIA manufactured by Pacific Western Systems, Redding, Calif. The system 10 utilizes a prober 12 which houses a semiconductor wafer (not illustrated) under test. The prober provides electrical interface between the tester subsystem 16 and individual devices under test. Typically the prober is preprogrammed to step through devices so the tester subsystem 16 can sequentially acquire data from all the devices on the wafer. An exemplary prober, model EG 2010 is manufactured by Electroglass Inc.

Referring also to FIG. 1, the tester subsystem 16 comprises a microprocessor controller 26 which reads a test program out of DRAM 30 to configure address counters 32, data I/O channels 36 and voltage levels for device signal drivers 38. The controller also loads a program stored in the DRAM into a pattern generator 40. The pattern generator controls address generation by the counters 32 and data states to be written to the prober 12 for input to the device under test. The pattern generator 40 also control read operations from the device under test to provide comparator circuitry 42 with data read out of the device under test as well as expected data. Based on differences between the read data and the expected data the comparator circuitry makes a pass-fail decision to determine if any of the device memory cells are defective.

Figure 2:
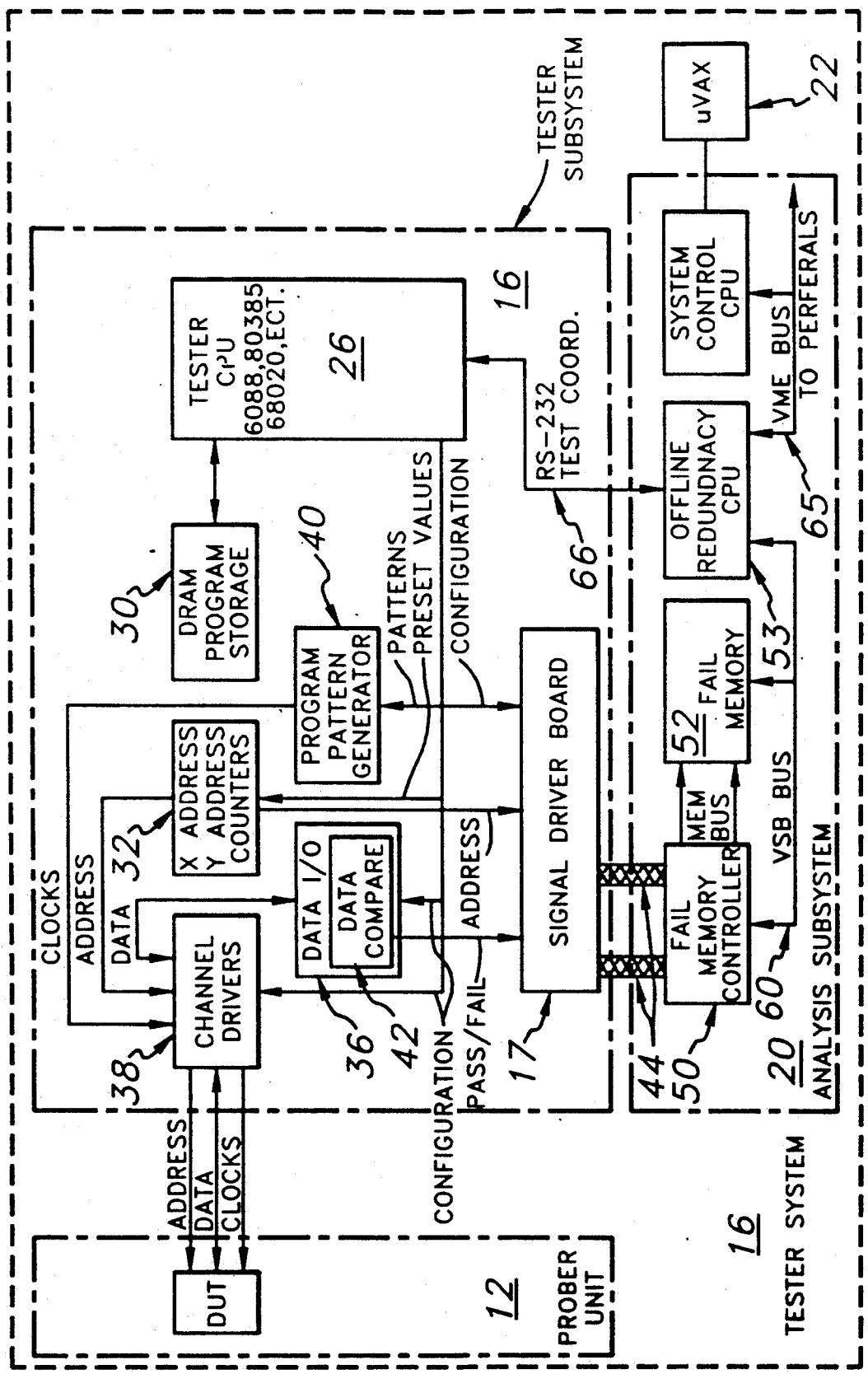
FIG. 2 illustrates in simple block form a memory test and analysis system according to a preferred embodiment of the invention.

With reference to FIG. 2 there is illustrated according to a preferred embodiment of the invention a memory test and analysis system 15 which generates repair and analysis information through the addition of an analysis subsystem 20 which can output said information to a data storage device, minicomputer or directly to a repair station. In the preferred embodiment the analysis system 20 includes interfacing hardware for transferring repair data to a minicomputer 22.

According to one embodiment of the invention, the comparator pass-fail and address signals for each cell are routed to a driver board 17 which replaces the memory test systems fail memory 34 (shown in FIG. 1.). The driver board 17 consists of the fundamental logic found on the memory test system fail memory 34 and deletes the fail memory storage area. The drive board 17 inputs all address and pass-fail signals intended for the test system fail memory 34 through twisted pair cables 44 to the analysis subsystem 20.

Figure 3:
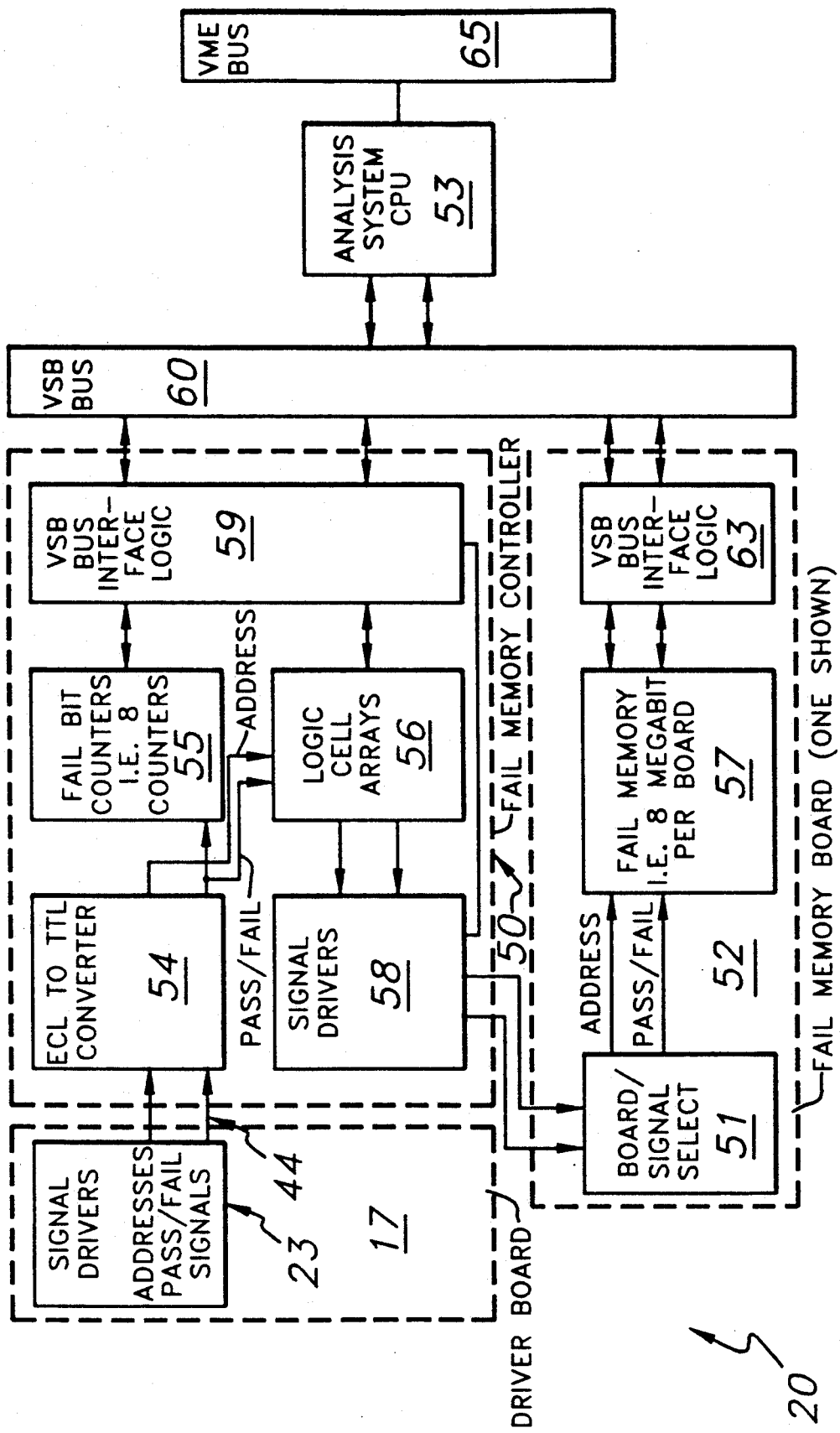
FIG. 3 illustrates, according to the invention, signal flow through the analysis subsystem of the illustrated generally in FIG. 2.

The analysis subsystem described herein is comprised of three major components consisting of the fail memory controller 50, the fail memory 52 and a computer 53. The above components are described in further detail with reference to FIG. 3.

The address and pass-fail signals collected and transmitted over the twisted pair cables 44 are input to ECL to TTL differential line receiver circuitry 54. The TTL level pass-fail signals are routed to group of counters 55 used to determine the number of fail signals received by the fail memory controller 50. The pass-fail signals are also routed to logic cell arrays 56 along with the TTL level address signals. The logic cell arrays 56 are used to scramble address and pass-fail signals to provide a wide range of device layouts to be made to the desired portions of the fail memory SRAM 57. The scrambled address and pass-fail signals are output from the logic cell arrays 56 to signal drivers 58 for input to a fail memory board 52. Control of the fail memory controller 50 is maintained through a logic interface 59 that is typical of and described by the Motorola definition of the VSB bus 60.

The fail memory SRAM 57 comprises a memory array capable of storing pass-fail information in a bit-per-bit fashion. The example fail memory shown in FIG. 3 consists of a signal selection section 61 which controls address and pass-fail data selection for a given fail memory board 52 and an 8 megabit section of fail memory 57. The signal selection section coupled with the address decode located in the logic interface 63 on the fail memory board 52 allows the overall analysis systems 20 fail memory size to be expanded by simply adding additional fail memory boards 52.

The computer 53 preferably comprises a high speed wide buss microprocessor 60 such as the Motorola 68020. Additionally, it is preferable the computer 53 supports at least two distinct data busses such as the VSB (Virtual Slave Bus) bus 60 and the VME (Virtual Memory Execution) bus 65 so that the computer 53 is allowed to support data analysis without interruption from other processes. A suitable system is model HK68/V2F available from Heurikon Corporation, Madison, Wis.

In operation the tester subsystem 16 of the system 10 interfaces with the prober 12 to initially perform DC electrical tests on the device under test. The DC tests verify proper electrical contact and device operating characteristics.

A common set of procedures has evolved for testing a device and determining a repair scheme wherein certain of the defective lines are designated for replacement with redundant lines. In the past, these procedures have sequentially included:
  performing DC electrical tests on the device under test to verify proper electrical contact and device operating characteristics;
  writing a test pattern to each memory cell in the device under test;

reading data stored in the device under test;
comparing data read from the device under test with the test pattern written to the device cells to identify defective cells;
storing the defective cell data in bit-mapped format in a fail memory;
analyzing the stored data to develop a repair scheme whereby one or more defective column or row lines are designated for replacement with redundant lines;
outputting the repair scheme to a minicomputer or repair system for subsequent implementation; and
repeating the sequence for a subsequent device.

One feature of the invention is recognition that the speed of the test and analysis process is severely limited by the prior art serial test and analysis sequence which has utilized a single microprocessor to perform control functions as well as computational tasks related to scanning the fail memory and determining which lines should be replaced. In fact, redundancy information can be generated faster and with greater detail according to the invention. That is, with a high speed processor the fail memory scan and data formatting functions are removed from the tester. In prior test and analysis systems a tester microprocessor was, at any given time, dedicated to either generating test data or analyzing the test data, i.e., the tester micro-processor could not perform multitasking operations.

The invention provides an architecture whereby the tester subsystem 16:
performs electrical tests;
writes a test pattern to each memory cell in the device under test;
reads data stored in the device under test; and compares data read from the device under test with the test pattern written to the device cells to identify defective cells.

Independently, the analysis subsystem 20:
analyzes the stored data to develop a repair scheme whereby one or more defective column or row lines are designated for replacement with redundant lines; and
outputs the repair scheme to a minicomputer or repair system for subsequent implementation.

The tester subsystem can operate on a second device (or set of devices) under test while the analysis subsystem 20 is analyzing data formerly collected by the tester subsystem 16. Thus two operations are performed in parallel.

Figure 4:
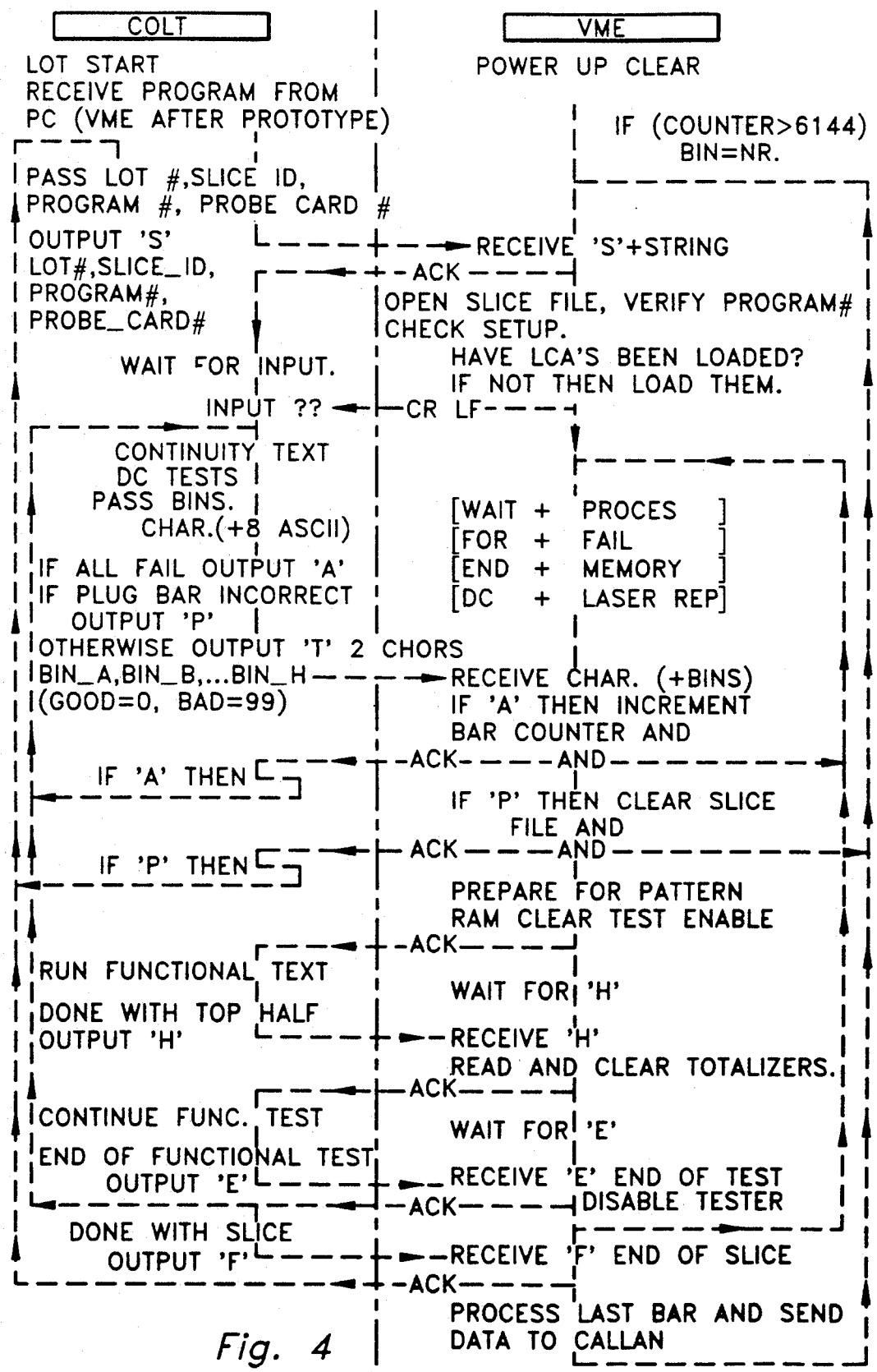
FIG. 4 provides a flow chart describing communications and data transfer between two subsystems according to a preferred embodiment of the invention.

The sequence of events is coordinated between the two subsystems 16 and 20 by sending control signals, e.g., via RS-232 ports 66, and coordinating test start, test end and other operations. The flow chart of FIG. 4 describes necessary communications between the two subsystems.

The system 10 has been used to test and develop a repair scheme for one megabit devices. The total test time for a wafer containing over 300 devices was approximately seven minutes. Similar tests performed with a prior art system, i.e., utilizing a single microprocessor, typically required 45 minutes or longer.

Redundancy information can be gathered with greater detail with the system 10. Such detailed analysis can be used to determine defect types, i.e., Software Defect Analysis (SDA), which was difficult or impractical to perform with prior art systems and which added to the length of test and analysis time. In contrast, an off-line redundancy analysis system provided a more efficient means to collect SDA data as well as redundancy data while providing the capability for testing ever increasing memory densities during reasonably short time periods

I claim:

1. A test system providing repair information for a semiconductor memory device of the type having addressable storage cells and redundant row or column lines of storage cells for replacing defective cells, comprising:
a first subsystem including a first microprocessor and pattern generating circuitry operable in conjunction with a probe unit to write binary values based on a test pattern to addressed cells in the memory device and read binary values stored in the memory device;
comparator circuitry coupled to the first subsystem for providing information identifying defective cells in the memory device based on differences between the binary values written into and read out of the addressed cells.
a fail memory coupled to the comparator circuitry for storing the information identifying the defective cells;
a second subsystem including a second microprocessor coupled to read the information from the fail memory said second subsystem designating a column or row line for replacement with a redundant line to correct a defect in the memory device.

2. The system of claim 1 wherein the comparator circuitry is formed as part of the first subsystem and is under the control of the first microprocessor.

3. The system of claim 1 wherein the fail memory comprises SRAM.

4. The system of claim 1 wherein the fail memory comprises 16 megabits of SRAM.

5. A method for testing and providing repair information for a first memory device of the type having addressable storage cells and redundant row or column lines of storage cells for replacing defective cells, the method comprising the steps of:
generating a test pattern for evaluating operation of the memory device;
writing the test pattern based on binary data into addressed storage cells of the memory device with a first microprocessor;
reading data stored in the addressed cells;
providing information identifying defective cells in the memory device by comparing the binary values written into addressed cells with binary values read out of the addressed cells;
storing the information in a fail memory device;
reading the information from the fail memory device with a second microprocessor; and
operating on the information with the second microprocessor to determine a repair pattern according to which a column or row line can be replaced with a redundant line to eliminate a defect in the memory device.

6. The method of claim 5 wherein the step of reading data stored in the addressed cells is performed with the first microprocessor.

7. The method of claim 5 wherein the step of storing the information in the fail memory device is performed with the first microprocessor.

8. The method of claim 5 further comprising the following steps at least one of which is performed while the second microprocessor operates on the information identifying defective cells in the first memory device:

generating a test pattern for evaluating operation of a second memory device;

writing the test pattern based on binary data into addressed storage cells of the second memory device with the first microprocessor; and reading data stored in the addressed cells of the second device.

9. The method of claim 5 further including the step of performing software defect analysis on the information with the second microprocessor.

* * * * *